(12) United States Patent
Kim

(10) Patent No.: US 7,557,565 B2
(45) Date of Patent: Jul. 7, 2009

(54) HANDLER FOR SORTING PACKAGED CHIPS

(75) Inventor: Jong Tae Kim, Daejeon-si (KR)

(73) Assignee: Mirae Corporation, Chungcheongnam-Do (KR)

( * ) Notice: Subject to any disclaimer, the term of this patent is extended or adjusted under 35 U.S.C. 154(b) by 105 days.

(21) Appl. No.: 11/790,039

(22) Filed: Apr. 23, 2007

(65) Prior Publication Data

US 2007/0262769 A1    Nov. 15, 2007

(30) Foreign Application Priority Data

May 12, 2006    (KR)    ....................... 10-2006-0042996

(51) Int. Cl.
G01R 31/28    (2006.01)
(52) U.S. Cl. .................................. 324/158.1
(58) Field of Classification Search ........................ None
See application file for complete search history.

(56) References Cited

U.S. PATENT DOCUMENTS

| | | | | |
|---|---|---|---|---|
| 5,788,084 A | * | 8/1998 | Onishi et al. ............. | 324/158.1 |
| 5,909,657 A | * | 6/1999 | Onishi et al. ................ | 702/108 |
| 6,198,273 B1 | * | 3/2001 | Onishi et al. ............. | 324/158.1 |
| 6,259,247 B1 | * | 7/2001 | Bannai ..................... | 324/158.1 |
| 6,515,470 B2 | * | 2/2003 | Suzuki et al. ............ | 324/158.1 |
| 6,956,390 B1 | * | 10/2005 | Feltner et al. ............... | 324/760 |
| 7,298,156 B2 | * | 11/2007 | Okuda et al. ................ | 324/765 |
| 7,348,768 B2 | * | 3/2008 | Lee .......................... | 324/158.1 |
| 2003/0188997 A1 | * | 10/2003 | Tan et al. ..................... | 209/538 |
| 2004/0259402 A1 | * | 12/2004 | Lee ............................. | 439/173 |

\* cited by examiner

*Primary Examiner*—Jermele M Hollington
(74) *Attorney, Agent, or Firm*—Ked & Associates LLP

(57) ABSTRACT

A handler for sorting semiconductor chips after they have been tested includes a loading unit for loading chips to be tested and an unloading unit for unloading chips that have been already tested. Chips arrive in trays at the loading unit, and a loading picker removes the chips from the tray. When a tray is empty, it is moved over to the unloading unit by a tray transfer mechanism so that tested chips can be placed back into the tray. The tray transfer mechanism rotates the empty trays upside down as it is moved from the loading unit to the unloading unit to ensure that the tray is completely empty before it arrives at the unloading unit.

23 Claims, 4 Drawing Sheets

HANDLER FOR SORTING PACKAGED CHIPS

BACKGROUND

1. Field

The present invention relates to a handler for sorting burn-in tested semiconductor chips, and more particularly to a tray-transferring unit for such a handler.

2. Background

Subsequent to wafer fabrication processing, a series of tests are typically formed on semiconductor chips to verify that they perform to specifications. An electrical test checks the general performance of the packaged chip and ensures that it meets certain input and output voltage, capacitance, and current specifications. A functional test actually exercises the specific chip functions. Burn-in tests are intended to stress the electrical interconnections of the chip and package and drive any contaminants in the body of the chip into the active circuitry, thus potentially causing failure. The early failures are detected by conducting the burn-in tests. The packaged chips that pass the burn-in test are statistically more reliable.

The burn-in test requires that the chips be mounted in rows and columns on a burn-in board. The burn-in board is then mounted in a test chamber with temperature-cycling capability. During the burn-in test, the circuits used and the chips are temperature cycled while under an electrical bias. After the burn-in testing is performed, the chips are sorted depending on whether they passed the test or failed the test.

A handler is typically used to mount chips on the burn-in board prior to testing, and to remove the tested chips from the burn-in board and to sort them after the burn-in tests have been conducted. The handler includes a main body, and a loading unit which is provided on one side of the main body. An unloading unit is used to place the tested chips in trays. The handler may further include a sorting unit which receives chips that have completely failed the tests, or chips that are suspect and require further testing.

In operation, the handler transfers burn-in tested packaged chips from a burn-in board to an empty tray waiting in the unloading unit. Simultaneously, chips which are to be subjected to the burn-in test are transferred from trays waiting in the loading unit onto the burn-in board. When a tray waiting in the loading unit is emptied, it is transferred to the unloading unit so that chips being removed from the burn-in board after testing can be re-loaded back onto the tray.

However, due to a variety of potential errors, sometimes not all chips are removed from a tray at the loading unit before the tray is transferred to the unloading unit. This could occur, for instance, if a loading picker fails to properly grasp and remove one or more chips on a tray at the loading unit. If this happens, when chips are subsequently unloaded onto the tray at the unloading unit, packaged chips from the burn-in board may be placed on top of a chip still remaining in the tray.

BRIEF DESCRIPTION OF THE DRAWINGS

The embodiments will be described in detail with reference to the following drawings in which like reference numerals refer to like elements, and wherein.

DETAILED DESCRIPTION

Figure 1:
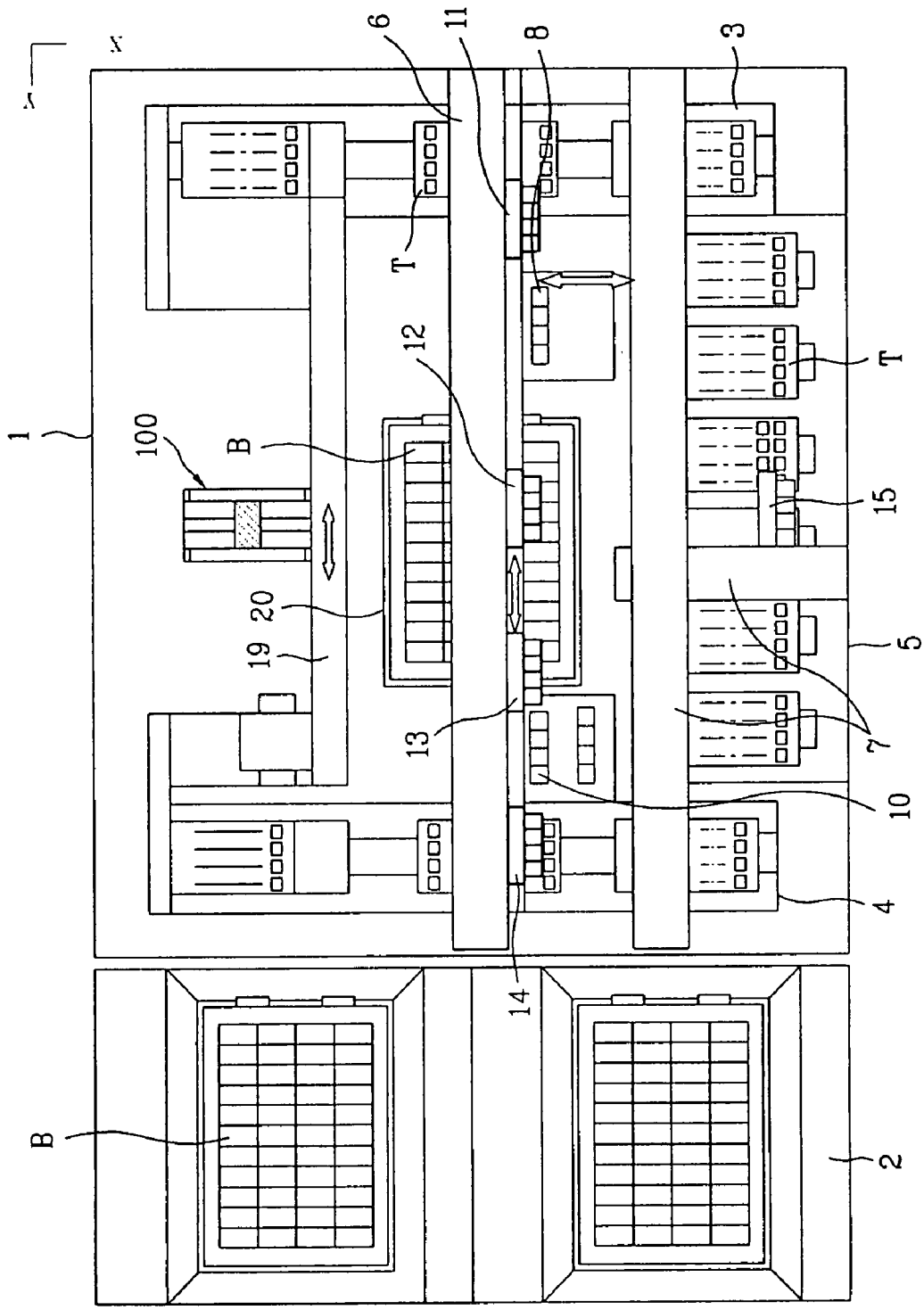
FIG. 1 is a view schematically illustrating a handler for sorting burn-in tested packaged chips.

As shown in FIG. 1, a handler for sorting burn-in-tested packaged chips includes a main body 1. A burn-in board 'B' containing burn-in-tested packaged chips is movable on the main body 1. A loading unit 3 receives trays containing packaged chips which are to be subjected to a burn-in test. An unloading unit 4 holds trays upon which packaged chips passing the burn-in test are to be placed.

A burn-in board transferring unit 20 moves the burn-in boards 'B' to the center of the main body 1, i.e., the working space. The loading unit 3 and the unloading unit 4 are provided on opposite sides of the main body with the burn-in board 'B' in between. A sorting unit 5 holds trays that contain bad packaged chips and chips which are to be re-tested. The sorting unit 5 is provided between the loading unit 3 and the unloading unit 4.

The tray-transferring unit 100 is provided to transfer trays from the loading unit 3 to the unloading unit 4. The tray-transferring unit 100 may be provided to one side of the main body, opposite the sorting unit 5, with the burn-in board between the tray transferring unit 100 and the sorting unit 5.

A rack 2, where one or more burn-in boards are placed, is provided adjacent to one side of the main body 1. The rack 2 includes a first rack holding burn-in boards which contain tested packaged chips that are to be subjected to the burn-in test and a second rack that holds burn-in boards of tested chips. The burn-in board transferring unit 20 transfers the burn-in boards 'B' from the rack 2 to working space 20 on the main body 1, and from the working space 20 back to the rack 2. The burn-in board transferring unit 20 may transfer the burn-in boards 'B' both in the 'X' and 'Y' directions and it may rotate the burn-in boards 'B' in the Θ direction. Thus, the tray transferring unit 20 is sometimes also referred to as an X-Y-Θ table.

A DC test unit 8, which performs an electrical test on packaged chips, is provided adjacent to one side of the loading unit 3. The DC test unit 8 may be provided between the loading unit 3 and the working space. This makes it possible to form the working space between the DC test unit 8 and the unloading buffer 10. In addition, an unloading buffer 10, which temporarily contains burn-in tested packaged chips, is provided adjacent to one side of the unloading unit 4.

An X-axis frame 6, which extends across the DC test unit 8, the burn-in board 'B', and the unloading buffer 10, is provided over the main body 1. A loading picker 11, an inserting picker 12, a removing picker 13, and an unloading picker 14 are provided on the X-axis frame 6.

The loading picker 11 transfers packaged chips to be subjected to the burn-in test from a tray at the loading unit 3 to the DC test unit 8. The inserting picker 12 removes the packaged chips from the DC test unit 8 and inserts them into the burn-in board 'B'. The removing picker 13 transfers chips from the burn-in board to the unloading buffer 10. The unloading picker 14 picks up and transfers the packaged chips from the unloading buffer 10 to a tray located on the unloading unit 4.

The packaged chips transferred to the DC test unit 8 receive an electrical test, known as a direct current (DC) test. The inserting picker 12 and the removing picker 13 move as one body. During a typical transfer operation, the removing picker 13 picks up packaged chips from the burn-in board and the inserting picker 12 picks up chips from the DC test unit 8. The two units move to the left in the x direction, and then the inserting picker 12 places packaged chips from the DC test unit 8 into the burn-in board at locations previously occupied by the packaged chips picked up by the removing picker 13. At the same time, the removing picker 13 places the chips from the burn-in board into the unloading buffer 10.

A sorting picker 15, transfers bad packaged chips from the DC test unit 8 and from the unloading buffer to the sorting unit 5. The sorting picker 15 is mounted on an X-Y frame 7 over the sorting unit 5. The sorting picker 15 can move along the X-Y frame 7 to any given point to release the bad packaged chips.

Figure 2:
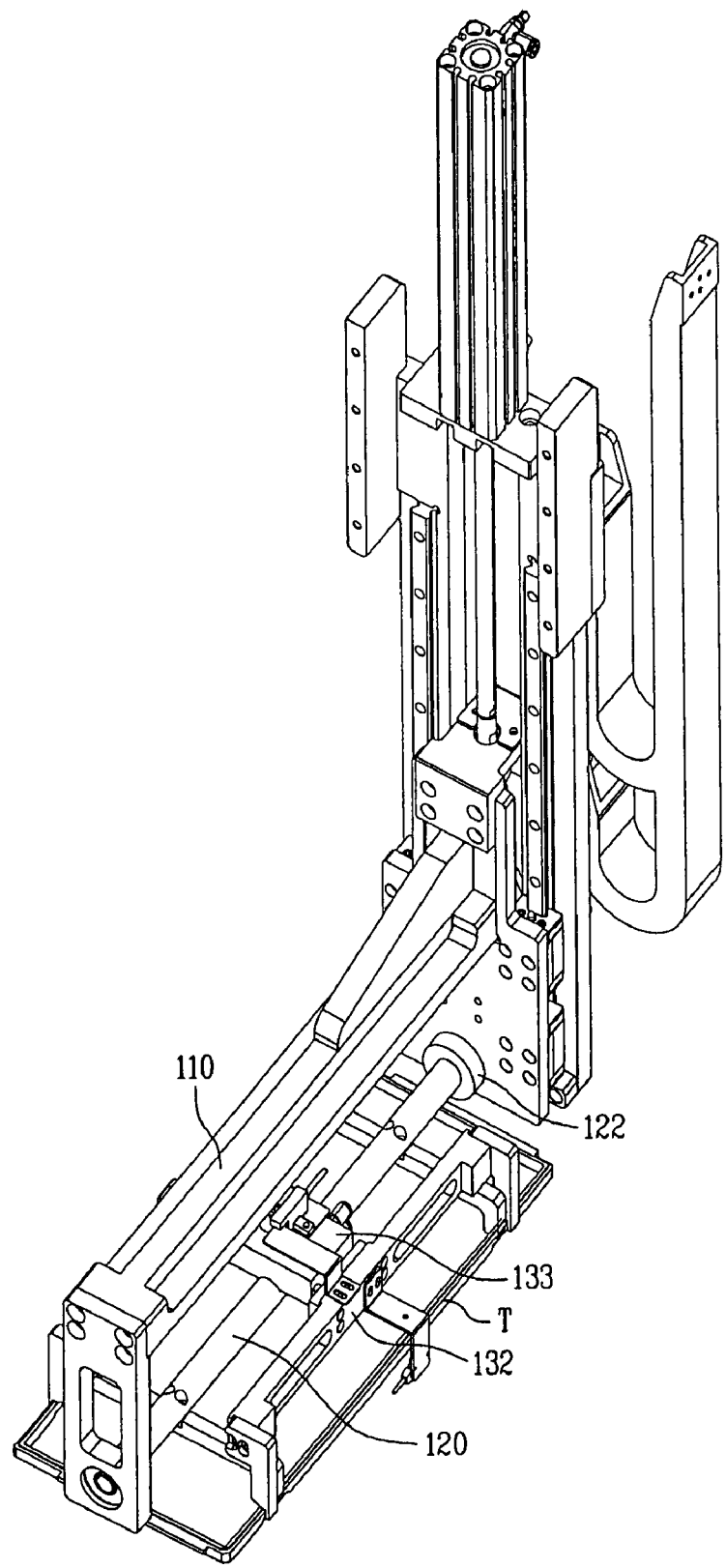
FIG. 2 is a perspective view illustrating a tray-transferring unit of the handler shown in FIG. 1.
Figure 3:
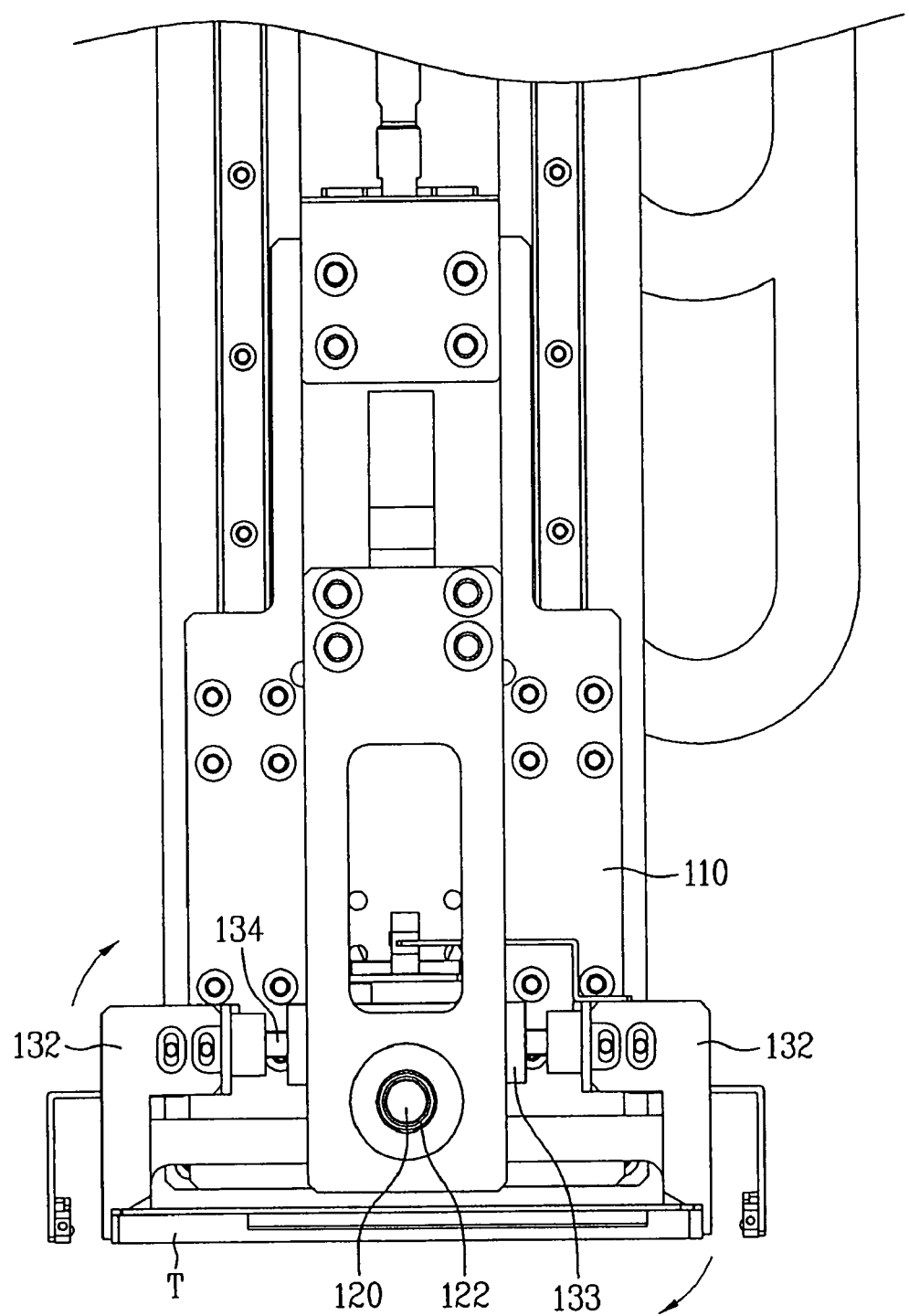
FIG. 3 is a front view illustrating the tray-transferring unit of FIG. 2.
Figure 4:
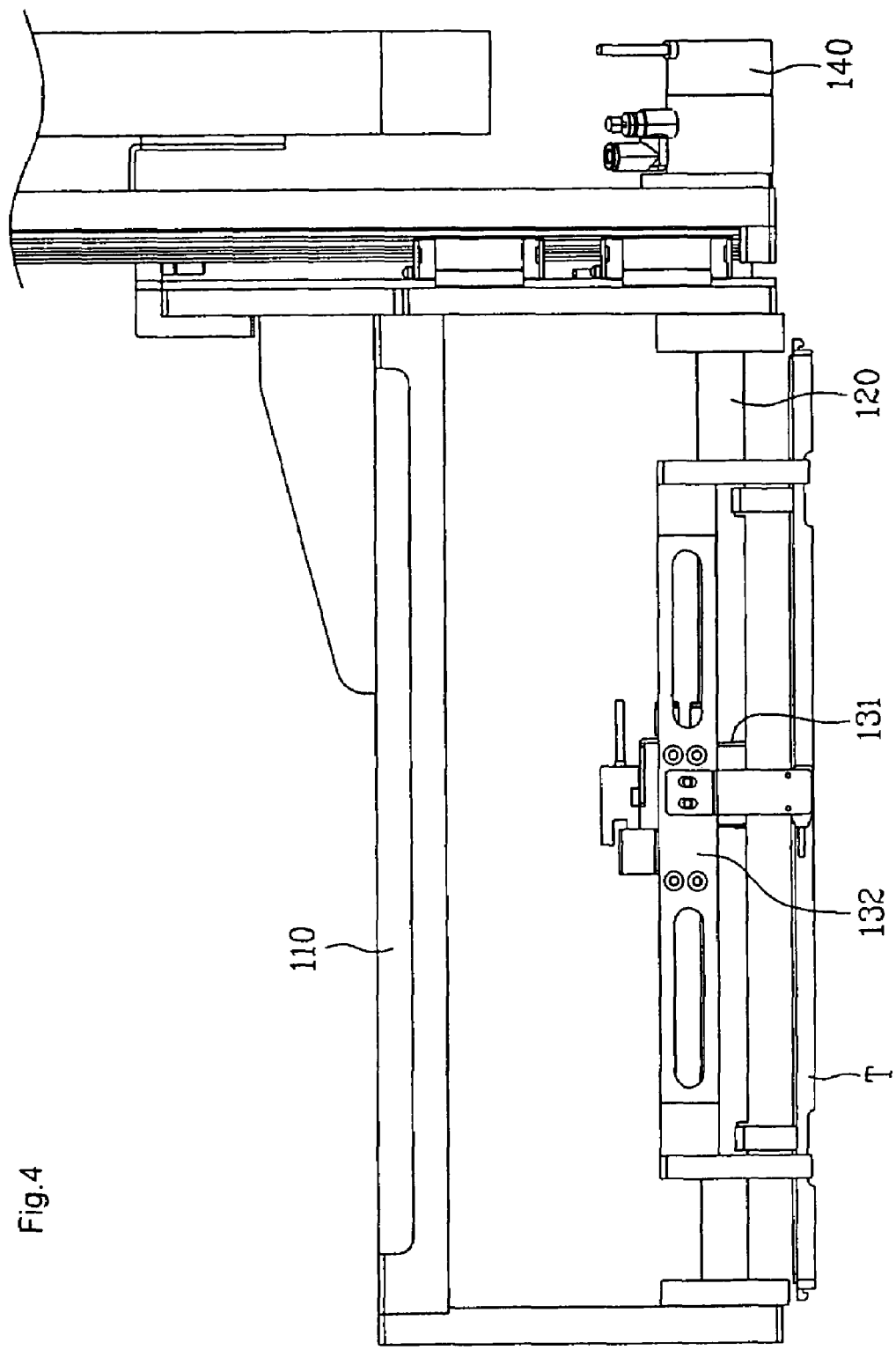
FIG. 4 is a side view illustrating the tray-transferring unit of FIG. 2.

The tray transferring unit 100, which transfers trays from the loading unit 3 to the unloading unit 4, is provided behind the loading unit 3 and the unloading unit 4 in such a manner that the tray transferring unit 100 is movable backwards and forwards along an X-axis tray frame 19. As shown in FIGS. 2-4, the tray transferring unit 100 includes a base frame 110 which is movable horizontally in the X-axis direction along the X-axis tray frame 19. The base frame is also movable vertically in the Z-axis direction. The tray transferring unit 100 also includes a holding unit for holding and releasing a tray 'T', a rotating unit for rotating a tray 'T', and a coupling unit 131 coupling the holding unit and the rotating unit.

The holding unit includes one or more holding members 132 configured to hold a tray 'T' and a first driving unit for moving the holding member(s) 132. In some embodiments, the first driving unit includes a piston rod 134 connected to the holding member 132 and an air pressure cylinder 133 enabling the piston rod 134 to move inward and outward so that the holding members can clamp onto and release a tray. In alternative embodiments, the air cylinder and piston rod can be replaced with a motor and a motion transferring member that transforms rotary motion of the motor into linear motion of the holding member. Other types of mechanisms could also be used to effect movement of the holding members, as will be known to those of ordinary skill in the art.

The rotating unit includes a rotating bar 120 which is used to rotate the holding unit and the attached tray 'T'. A second driving unit 140 acts to rotate the rotating bar. The rotating bar 120 is mounted on the base frame 110 such that it is with respect to a rotational axis of the rotating bar 120. Bushings 122 supporting the rotating bar, may be provided on both ends of the rotating bar 120.

The coupling unit 131 couples the rotating bar 120 and the holding unit. Therefore, the holding unit and the coupling unit 131 rotate together with the rotating bar, when the rotating bar 120 rotates. One side of the coupling unit 131 connects to the middle of the rotating bar 120 and the other side connects to the air pressure cylinder 133 of the holding unit. The pair of piston rods 134 connect to the holding member 132 and move the holding members so that they hold and release opposite sides of the tray 'T'.

The second driving unit 140, which rotates the rotating bar 120 in first and second directions, is provided behind the base frame 110. The second driving unit 140 may include a rotary motion apparatus, such as a rotary cylinder. Such a device is used to rotate the rotation bar 120 through a predetermined angle in one direction and in the opposite direction using air pressure. Alternatively, the second driving unit could simply rotate the rotating bar in a single rotation direction so that the attaching holding members are rotated through a full 360 degrees of movement. In alternative embodiments, the second driving unit 140 may include a motor connected to one end of the rotation bar 120 for rotating the rotation bar 120. The second driving unit 140 may also include a variety of other types of rotary motion apparatus.

In operation, a burn-in board 'B' containing burn-in tested packaged chips is first moved from the rack 2 to the working space, i.e., the middle of the main body. At the same time, a tray 'T' in the loading unit 3 is moved from the front of the handler to a position under the X-axis frame 6. Then, the loading picker 11 picks up packaged chips from the tray in the loading unit 3 and transfers the packaged chips to the DC test unit 8. The DC test unit 8 performs the DC test on the packaged chips. The loading picker 11 will continue to move between the loading unit 3 and the DC test unit 8 to transfer packaged chips from the tray at the loading unit 3 to the DC test unit 8.

The inserting picker 12 moves over the DC test unit 8 and the removing picker 13 moves over the burn-in board 'B'. After the DC test unit 8 performs the DC test on packaged chips, the inserting picker 12 picks up packaged chips from the DC test unit 8 and moves over the burn-in board, holding the packaged chips. Simultaneously, the removing picker 13 picks up burn-in-tested packaged chips from the burn-in board and moves to the unloading buffer 10, holding the burn-in tested packaged chips. Typically, the removing picker 13 picks up packaged chips from certain positions on the burn-in board and the inserting picker 12 places packaged chips on places previously occupied by the packaged chips picked up by the removing picker 13. However, this may not always be the case.

The inserting picker 12 and the removing picker 13 together repeat a so-called picking-up and placing operation to move new chips to be tested onto the burn-in board, and to move already tested chips off the burn-in board and over to the unloading buffer.

Subsequently, the unloading picker 14 picks up good packaged chips that have passed the burn-in test from the unloading buffer 10 and places the picked-up good packaged chips in a tray 'T' at the unloading unit 4. At the same time, the sorting picker 15 moves along the X-Y axis frame 7 to pick up bad packaged chips from the unloading buffer 10 and to transfer the bad packaged chips to a tray 'T' in the sorting unit 5.

After burn-in tested packaged chips have been picked up from a burn-in board 'B' and new packaged chips to be subjected to the burn-in test are placed on the places in the burn-in board 'B', previously occupied by the picked-up burn-in tested package chips, the board transferring unit 20 transfers the burn-in board 'B' to the rack 2.

Once all packaged chips contained in a tray 'T' at the loading unit 3 have been moved to the DC test unit 8, the empty tray 'T' moves behind the loading unit 3. Subsequently, the tray transferring unit 100 grasps the empty tray 'T' using the holding members 132, and transfers the empty tray 'T' over to the unloading unit 4.

When the base frame 110 reaches a given position while moving along the X-axis tray frame 19 from the loading unit 3 to the unloading unit 4, the second driving unit 140 operates to rotate the empty tray 'T'. That is, the tray transferring unit 100 rotates the empty tray 'T' upside down during the transfer of the empty tray 'T' to ensure that all chips on the tray have been removed.

More specifically, when the second driving unit rotates the rotation bar by 180 degrees, the coupling unit and the holding unit coupled to the rotation bar rotate together with the rotation bar, and thus a tray 'T' coupled to the holding unit 132 rotates by 180 degrees. The 180 degree rotation of the rotation bar turns the tray 'T' upside down. Thus, any chips that may remain on the tray drop downwards from the tray 'T'. The remaining packaged chips dropping from the tray 'T' gather in a collection box (not shown) provided under a specific position between the loading unit 3 and the unloading unit 4. Once any remaining chips have been dropped out, the second driving unit rotates the tray back to the upright position.

When the tray transferring unit 100 transfers an empty tray 'T' to the unloading unit 4, the holding members 132 are spread apart to release the empty tray 'T'. The released empty tray 'T' reaches the unloading unit 4. Thereafter, the tray transferring unit 100 moves back to the loading unit 3 to transfer the next empty tray 'T' from the loading unit 3

The handler for sorting packaged chips according to the present invention is capable of turning a tray upside down during transfer of the tray from the loading unit to the unloading unit to remove packaged chips remaining in the tray. This prevents tested packaged chips that are being unloaded from the burn-in board from being placed on top other chips that were mistakenly left in the tray.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although a number of illustrative embodiments have been described, it should be understood that numerous other modifications and embodiments can be devised by those skilled in the art that will fall within the spirit and scope of the principles of this disclosure. More particularly, variations and modifications are possible in the component parts and/or arrangements of the subject combinations which would still fall within the scope of the disclosure, the drawings and the appended claims. In addition to variations and modifications in the component parts and/or arrangements, alternative uses will also be apparent to those skilled in the art.

What is claimed is:

1. A handler that sorts semiconductor chips, the handler comprising:
   a main body;
   a loading device that conveys a tray bearing chips to be tested to a loading location;
   an unloading device that conveys a tray bearing tested chips away from an unloading location; and
   a tray transfer device that conveys a tray substantially emptied of the chips at the loading device from the loading device to the unloading device, wherein the tray transfer device operates to ensure that all chips have been emptied from the tray while passing from the loading device to the unloading device and the tray transfer device delivers the empty tray to the unloading device.

2. The handler of claim 1, wherein the tray transfer device inverts the tray upside down to ensure that any chips remaining on the tray received from the loading device are removed from the tray.

3. The handler of claim 2, wherein the tray transfer device also turns the tray back right side up before the tray is delivered to the unloading device.

4. The handler of claim 2, wherein the tray transfer device inverts the tray upside down over a collection bin so that any chips remaining in the tray are dumped into the collection bin.

5. The handler of claim 1, wherein the tray transfer device comprises:
   a movable frame;
   a holding device that includes at least one holing member that is movably mounted on the movable frame such that the at least one holding member clamps onto and releases the tray; and
   a rotating device that operates to rotate the tray held by the at least one holding member upside down.

6. The handler of claim 5, wherein the holding device further includes a moving mechanism that moves the at least one holding member to clamp onto and to release the tray.

7. The handler of claim 6, wherein the moving mechanism comprises at least one air cylinder coupled to the movable frame and the at least one holding member.

8. The handler of claim 5, wherein the rotating device comprises:
   a rotating shaft mounted on the movable frame, wherein the holding device is coupled to the rotating shaft; and
   a rotating mechanism that rotates the rotating shaft.

9. The handler of claim 8, wherein the rotating mechanism comprises a motor.

10. The handler of claim 8, further comprising a coupling device that couples the holding device to the rotating shaft.

11. The handler of claim 5, wherein the movable frame is movable a Z axis direction on the tray transfer device.

12. The handler of claim 11, wherein the movable frame is also movable in the X axis direction between the loading device and the unloading device.

13. The handler of claim 5, wherein the movable frame is also movable in the X axis direction between the loading device and the unloading device.

14. The handler of claim 1, wherein the loading device moves the tray from the loading location to a first transfer position after chips on the trays have been unloaded from the tray, wherein the tray device picks up the tray from the first transfer position and conveys the tray to a second transfer position, and wherein the unloading device moves the tray from the second transfer position to the unloading location.

15. The handler of claim 14, wherein the tray transfer device inverts the tray upside down while moving the tray between the first transfer position and the second transfer position to ensure that all chips are removed from the tray before the tray is delivered to the second transfer position.

16. A tray transfer device that transfers a tray configured to hold semiconductor chips from a first tray handling device where it is substantially emptied of the chips to a second tray handling device, wherein the tray transfer device ensures that all chips have been emptied from the tray while being transferred from the first tray handling device to the second tray handling device, the tray transfer device comprising:
   a movable frame;
   a holding device that includes at least one holding member that is movably mounted on the movable frame such that the holding device clamps onto and releases the tray; and
   a rotating device that operates to rotate the tray held by the holding device upside down.

17. The tray transfer device of claim 16, wherein the rotating device comprises:
   a rotating shaft mounted on the frame, wherein the holding device is coupled to the rotating shaft; and
   a rotating mechanism that rotates the rotating shaft.

18. The tray transfer device of claim 17, further comprising a coupling device that couples the holding device to the rotating shaft.

19. The tray transfer device of claim 16, wherein the movable frame is movable in a Z axis direction.

20. The tray transfer device of claim 16, wherein the movable frame is movable between the first tray handling device and the second tray handling device.

21. The tray transfer device of claim 16, wherein the device rotates the tray held by the holding device upside down as the tray is moved from the first tray handling device to the second tray handling device so that chips on the trays are removed before the tray arrives at the second tray handling device.

22. A method of removing semiconductor chips from a tray configured to hold the semiconductor chips, wherein the tray is being transferred from a loading location where the tray is substantially emptied of the semiconductor chips to an unloading location, the method comprising:

picking up the tray with a handling device at the loading location;

turning the tray upside down to remove any remaining chips in the tray; and moving the empty tray to the unloading location.

23. The method of claim 22, further comprising turning the tray right side up after the tray has been turned upside down.

* * * * *